United States Patent [19]

Hu et al.

[11] Patent Number: 5,467,294
[45] Date of Patent: Nov. 14, 1995

[54] HIGH SPEED, LOW POWER DIRECT DIGITAL SYNTHESIZER

[76] Inventors: Vince Hu, 13031 Delano St., Van Nuys, Calif. 91401; James Wang, 2625 Monterey Rd., San Marino, Calif. 91108

[21] Appl. No.: 207,705

[22] Filed: Mar. 9, 1994

[51] Int. Cl.[6] ........................... G06F 1/02
[52] U.S. Cl. ........................... 364/721; 327/106
[58] Field of Search ............... 364/721; 328/14; 327/106

[56] References Cited

U.S. PATENT DOCUMENTS

| | | | |
|---|---|---|---|
| 4,476,536 | 10/1984 | Jones, Jr. | 364/721 |
| 4,809,205 | 2/1989 | Freeman. | |
| 4,827,442 | 5/1989 | Mehrgardt et al. | 364/721 |
| 4,926,130 | 5/1990 | Weaver. | |
| 4,951,004 | 8/1990 | Sheffer et al.. | |
| 4,951,237 | 8/1990 | Esenwanger. | |
| 4,975,699 | 12/1990 | Frey. | |
| 4,992,743 | 2/1991 | Sheffer. | |
| 4,998,072 | 3/1991 | Sheffer. | |
| 5,010,506 | 4/1991 | Hrncirik. | |
| 5,014,231 | 5/1991 | Reinhardt et al.. | |
| 5,028,887 | 7/1991 | Gilmore. | |
| 5,031,131 | 7/1991 | Mikos. | |
| 5,045,817 | 9/1991 | Sheffer. | |
| 5,063,361 | 11/1991 | Smith et al.. | |
| 5,113,361 | 5/1992 | Damerow et al. | 364/721 |
| 5,128,623 | 7/1992 | Gilmore. | |
| 5,144,571 | 9/1992 | Thong. | |
| 5,184,092 | 2/1993 | Shahriary et al.. | |
| 5,276,633 | 1/1994 | Fox et al. | 364/721 |

*Primary Examiner*—Tan V. Mai
*Attorney, Agent, or Firm*—Hoffman, Wasson & Gitler

[57] ABSTRACT

A method and apparatus suitable for generating programmable digital sine waves which involves converting the output of a direct digital synthesizer or numerically controlled digital oscillator to a higher frequency with a multiplier-less structure that takes advantage of the properties of trigonometric identifies for sine and cosine. Sine waves are generated digitally using a phase accumulator which is clocked at one fundamental frequency. The phase accumulator input provides a control word which determines the intermediate frequency of the direct digital synthesizer output. Taking advantage of the periodicity of the phase accumulator operation, the outputs of the accumulator are utilized to address a read only memory ROM lookup table which produces in-phase and quadrature samples of the sine wave at the intermediate frequency. The in-phase and quadrature samples are then complemented (i.e. negated) to produce an additional set of in-phase and quadrature samples which are 180° out of phase from the original samples. Switching between these four possible outputs at a higher fundamental clock frequency results in the translation of the intermediate frequency output to a higher frequency.

6 Claims, 5 Drawing Sheets

Reduction of Phase to Amplitude Conversion Table
Using Quadrature Symmetry

SPECTRUM OF I(T)

SPECTRUM OF MULTIPLYING
MULTIPLEXING SIGNAL

SPECTRUM OF S(T)

HIGH SPEED, LOW POWER DIRECT DIGITAL SYNTHESIZER

BACKGROUND

1. Field of Invention

This invention relates to direct digital frequency synthesizers and the implementation of numerically controlled digital oscillators. Specifically, the invention consists of a new and improved technique which generates sinusoids digitally.

2. Discussion of Prior Art

An attractive alternative to frequency synthesis is a digital or sampled technique. The digital frequency synthesis approach employs a stable source frequency to define sampling times at which digital sinusoidal sample values are produced. These samples are converted from digital to analog format and smoothed in time by some realizable linear filter to produce analog frequency signals. The primary building block for this approach is the direct digital synthesizer or DDS. A DDS typically consists of a phase accumulator and a sine function lookup table. The input to the phase accumulator is a frequency control word which determines the periodicity of the phase accumulator. The phase accumulator is updated to a digital sine or cosine sample using the sine or cosine function lookup table. This output is then converted to an analog signal using a digital to analog converter.

Since its inception, previous inventors have created several types of improvements conceived to improve the resolution, the reduction of spurious signal components, fundamental fidelity, and reduce circuit complexity in direct digital synthesizers.

U.S. Pat. No. 5,144,571 (Direct Digital Synthesizer with Feedback Shift Register) to Thong (1992) discloses a DDS architecture which employs a linear feedback shift register used as a counter. The output of the linear feedback shift register is decoded to provide a control signal to control logic which then loads one of a multiple of selectable input frequency control words to the phase accumulator of the DDS. This process affects the overall frequency and phase of the periodic output waveform. The primary focus of this invention involves an improved device for providing a programmable frequency index to effect phase changes in the output waveform, but does not propose any innovation in increasing the final output signal frequency beyond that provided means provided in the traditional DDS architecture.

U.S. Pat. No. 5,128,623 (Direct Digital Synthesizer/Direct Analog Synthesizer Hybrid Frequency Synthesizer) to Gilmore (1992) discloses a digital/analog hybrid frequency synthesizer having a direct digital synthesizer and a bank of analog input frequency signals separated by fixed frequency intervals. The desired output signal is then generated by mixing the appropriate analog input signal and the direct digital synthesizer output. The principle focus of this invention involves a device to generate a frequency signal through the use of a DDS with analog frequency conversion rather than proposing a specific change to the DDS architecture.

U.S. Pat. No. 5,063,361 (Direct Digital Synthesizer) to Schindler and Smith (1991) discloses a DDS architecture which includes a pair of phase shifter channels with inputs and outputs coupled with radio frequency (RF) make before break switches which provides smoother phase advances and eliminates fly-back transitions to reduce excess noise power in the output. As with the previous patents, this invention proposes the use of a DDS within a network of analog RF phase shifters designed to improve output waveform transitions rather than proposing a specific change to the DDS architecture.

U.S. Pat. No. 5,045,817 (FM Deviation Control of Direct Digital Synthesizer) to Sheller (1991) discloses a direct digital synthesizer which is employed for frequency modulation using bit shifting of the frequency control word and minor adjustment of the system clock to obtain finer resolution in setting frequency modulation (FM) deviation. The principle focus of this invention involves a novel device for employing the standard DDS architecture to improve tuning resolution and does not propose a specific change to the DDS architecture.

U.S. Pat. No. 5,031,131 (Direct Digital Synthesizer) to Mikos (1991) discloses a direct digital synthesizer architecture with a pipelined phase accumulator to increase speed which includes several on-chip digital to analog converters, multiple look-up tables with differing phase spacing between addresses with a selector to best select the look-up table which provides optimum performance, and also possibly some multiple additional look-up tables for the correction of the output waveform. This invention proposes a unique combination of on-chip features which provide flexibility to the user but does not effect a significant change to the DDS architecture.

U.S. Pat. No. 5,014,231 (Randomized Digital/Analog Converter Direct Digital Synthesizer) to Gould et al (1991) discloses a sine output or phase interpolation direct digital synthesizer for use in satellite programs having a random or pseudorandom code generator for summing a random digital word whose value ranges from zero to just under the least significant bit of a digital to analog converter, with the current register value normally sent to the converter for reducing the spurious sidebands associated with the finite resolution of the converter. By controlling the converter in this manner, the spurious sidebands are reduced by randomization of the periodic behavior associated with the truncation process while lowering total phase noise. Reduction of spurious phase sidebands by conversion to broadband phase noise is accomplished using a pseudo noise (PN) code generator to produce an additive term to the phase accumulator output with magnitude between zero and the least significant bit (LSB) with the purpose of randomizing the coherent phase noise. The truncated sum and carry are processed separately. The truncated sum is used to address the lookup table. The carry pulse is delayed by an amount proportional to the truncated sum and then added back to the phase accumulator input. This patent proposes a specific change to the DDS architecture designed to improve spurious signal performance and does not propose any innovations involving power and/or complexity reduction while generating higher output signal frequency.

U.S. Pat. No. 5,010,506 (Spurious Level Reduction and Control Method for Direct Digital Synthesizers) to Hrncirik (1991) discloses a direct digital synthesizer which has a select input at the phase accumulator which detects when power disruption or frequency changes have occurred. Upon restoration of power or change to a new frequency, the phase accumulator employs the select input latch in a predetermined initial phase and thereafter reverting to a nominal control word for operation to accomplish an overall reduction in the spurious output signal level. As with the previous patent, this invention proposes a specific change to the DDS architecture designed to improve spurious signal performance but does not propose any innovations involving power and/or complexity reduction while generating higher output signal frequency.

U.S. Pat. No. 4,998,072 (High Resolution Direct Digital Synthesizer) to Sheffer (1991) discloses a direct digital synthesizer which incorporates a device for alternately asserting two distinct phase increments, thereby achieving an effective increment value proportional to a value between these two increments. Alternating between the two increment values is controlled so the multiple fractional increment values can be achieved. The principle focus of this patent involves a change to the DDS architecture permitting finer tuning resolution and does not propose any innovation involving power and/or complexity reduction while generating higher signal frequency output.

U.S. Pat. No. 4,992,743 (Dual-Tone Direct Digital Synthesizer) to Sheffer (1991) discloses a plural-tone direct digital synthesizer comprising in combination: at least one phase accumulator which receives a clock signal input and phase increment input for producing a sequence of phase information signals, at least one phase-to-amplitude converter for producing a sequence of amplitude signals in response to this sequence of phase information signals, and a device for combining an output of an additional phase accumulator and phase-to-amplitude converter. Digital to analog conversion is then performed on these two signals which are then added using an analog summer in order to obtain spectral components of both signals. Another embodiment includes the digital summation of the two output frequencies. Yet another embodiment includes two phase accumulators with a multiplexer sharing one lookup table. The digital outputs from the lookup table are digitally summed. The novelty of this patent results from a unique combination of dual DDS function and does not involve any specific changes to the DDS architecture itself.

U.S. Pat. No. 4,975,699 (Error Reduction Method and Apparatus for a Direct Digital Synthesizer) to Frey (1990) discloses a circuit for generating an analog sine voltage from a digital phase input employing memory storing sine and cosine values and a correction value for each phase and first and second digital to analog converters (DAC). For each digital phase input, selected sine and cosine values are combined, and the result is read out to the first DAC which generates an analog sine approximation voltage. A corresponding correction value is simultaneously read out to the second DAC, whose output is scaled by an attenuator to provide a correction voltage for correcting the deviation in the output voltage of the first DAC from the ideal sine voltage value. This patent proposes a change to the DDS architecture which involves the calculation of an error correction term which is ultimately applied to the output signal external to the DDS. This patent does not propose any innovations designed specifically to reduce the power or complexity of the DDS architecture while generating high frequency output signals.

U.S. Pat. No. 4,951,237 (Direct Digital Synthesizer with Selectably Randomized Accumulator) to Essenwanger (1990) discloses a direct digital synthesizer with a phase accumulator, wherein a selected few of the low order accumulator bits are dithered by a PN number generator in order to introduce flat frequency deviation density to suppress spurious signals including those close to the output or fundamental frequency. The accumulator circuit may advantageously be sectioned into a lower order accumulator and higher order accumulator in a pipelined combination with a sine approximation output circuit wherein such a spurious signal suppression is achieved without decreasing system throughput. This patent involves a change to the DDS architecture designed to improve the spurious signal performance, but does not propose any innovation designed to increase the frequency range while reducing power and complexity.

U.S. Pat. No. 4,951,004 (Coherent Direct Digital Synthesizer) to Drucker (1990) discloses a coherent direct digital waveform synthesizer, capable of generating a waveform in response to a decimally or other non-binary related reference frequency while obtaining the advantages of the use of a binary radix phase accumulator generating binary addresses for a waveform memory. The interface between these elements include a frequency converter including a voltage controlled oscillator and a further binary radix phase accumulator in the feedback path of a phase locked loop. A binary radix related digital waveform synthesizer may thus be made to produce non-binary related frequency waveforms coherent with a non-binary radix reference frequency source, and of decimal or other non-binary radix related resolution. This patent involves the use of a DDS function to generate an output frequency which may not be related to the reference frequency in a binary sense. While the patent proposes a novel use of the DDS, it does not propose an innovation to the DDS architecture itself.

U.S. Pat. No. 4,926,130 (Synchronous Up-Conversion Direct Digital Synthesizer) to Weaver (1990) discloses a method and apparatus for generating high frequency signals, comprising generating a fundamental frequency signal over a predetermined tuning range using a direct digital synthesizer with a digital to analog converter operating at a predetermined sampling frequency and mixing the fundamental frequency with a high frequency reference signal in a mixer connected to the converter and the reference source. The reference frequency signal is provided by the reference source at a high frequency which is a multiple of the digital to analog converter sampling frequency and is the difference between a desired high frequency output and the fundamental frequency. Where desired, a low pass filter is disposed between the synthesizer and the mixer and the bandpass filter is disposed between the mixer and any output elements. A divided by N element can be connected between the reference source and the digital to analog converter to provide a sampling clock signal for the converter. In addition, the reference source can operate at even higher frequencies and a divided by M element is disposed between the reference source and both the divided by N element and the mixer. This allows the reference to be used for additional upconversion mixing with low noise at high multiples of the converter sampling frequency to achieve higher output frequencies. This patent involves a technique of synchronous upconversion which employs a DDS function to generate a higher frequency output signal. In this case, the innovation focuses on a process which uses a DDS and does not propose any specific change within the DDS architecture.

U.S. Pat. No. 4,809,205 (Digital Sine Conversion Circuit for Use in Direct Digital Synthesizers) to Freeman (1989) discloses a technique to reduce the size, power and speed constraints in a direct digital synthesizer by constructing the read only memory (ROM) sine table lookup with two smaller "primary" and "secondary" amplitude ROMs and a third smaller amplitude "correction" ROM. The primary ROM provides a coarse approximation to sine by quadrant. This patent involves an innovation associated with the implementation of the lookup table function and does not propose any innovation which increases the desired output signal frequency without a significant power and complexity increase.

Additionally, other previous inventors have created techniques which involve the generation of high frequency sine waves which employ a combination of analog phase locked loops (PLLs) and a direct digital synthesizer.

U.S. Pat. No. 5,184,092 (Phase-Locked Loop Frequency Tracking Device Including a Direct Digital Synthesizer) to McNab et al (1993) discloses an invention which consists of a phase-locked loop that uses a standard DDS. In this patent, a frequency control word to the DDS provides coarse resolution in frequency tuning while the error signal of the loop is used to drive a voltage controlled oscillator (VCO) which is used as the system clock for the DDS to provide finer tuning resolution than conventional PLL designs which incorporate a DDS. The principal embodiment also includes a programmable counter for sweeping the initial frequency with a digital limiter for limiting the sweep range.

U.S. Pat. No. 5,028,887 (Direct Digital Synthesizer Driven Phase Lock Loop Frequency Synthesizer with Hard Limiter) to Gilmore (1991) discloses a frequency synthesizer which uses a direct digital synthesizer to generate a reference signal in a phase lock loop that is compared against the desired signal divided by N to generate an error signal for the VCO of the phase lock loop in one embodiment. In another embodiment, the direct digital synthesizer is directly in the feedback loop and receives a frequency control word proportional to the loop error signal. Amplitude limiting is performed upon the DDS output signal. The DDS generates an accurate periodic signal of a frequency selected from a plurality of reference frequencies. A PLL receives the DDS generated reference signal and a divide by N signal for generating an output signal at a frequency determined by the divide by N signal. The frequency resolution of the PLL is N times the reference signal. In a second embodiment, the DDS is incorporated within the feedback path of the PLL. An input reference frequency signal is provided to the PLL with the DDS clock signal provided as a function of the PLL output frequency. The DDS receives an input frequency control signal which determines the DDS step size. The synthesizer output frequency is a function of the input reference, the number of bits in the digital word of the frequency control signal, and the DDS step size as determined by the frequency control signal.

All of these inventions focus primarily upon the use of a DDS in a phase lock loop rather than proposing improvements to the DDS architecture itself.

SUMMARY OF THE INVENTION

The present invention overcomes the deficiencies of the prior art by employing a DDS architecture which, by complementing and multiplexing at higher speed the output of sine and cosine samples from the phase to amplitude lookup table, results in higher output frequency in the desired output signal. This DDS would improve the prior art in which an increase in the highest possible desired output signal frequency requires a corresponding increase in the frequency of operation of their phase accumulator and phase to amplitude conversion lookup table functions which results in higher power dissipation. Furthermore, the ultimate operating speed of the prior art architectures is strictly limited by the speed of the phase accumulator and/or the speed of the phase to amplitude conversion lookup table functions. Finally, generating a specific output frequency from prior art DDS's requires more power than the present invention, because the phase accumulator and phase to amplitude conversion tables must operate at an increased speed.

Accordingly, the present invention provides an increase in the highest possible desired output signal frequency without requiring a corresponding increase in the frequency of operation of the phase accumulator and the phase to amplitude conversion lookup table functions without significantly increasing power dissipation.

Additionally, the present invention eliminates the limitation of the operating speed of the DDS architecture by the limitations of the operating speed of the phase accumulator functions and/or the operating speed of the phase to amplitude conversion lookup table functions.

Furthermore, the teachings of the present invention achieve power savings over the prior DDS architectures by generating the same output frequency while reducing the required frequency of operation of the phase accumulator and phase to amplitude conversion lookup tables.

Still further objects and advantages of the present invention will become apparent from a consideration of the ensuing description and drawings.

DETAILED DESCRIPTION OF PREFERRED INVENTION

Figure 1:
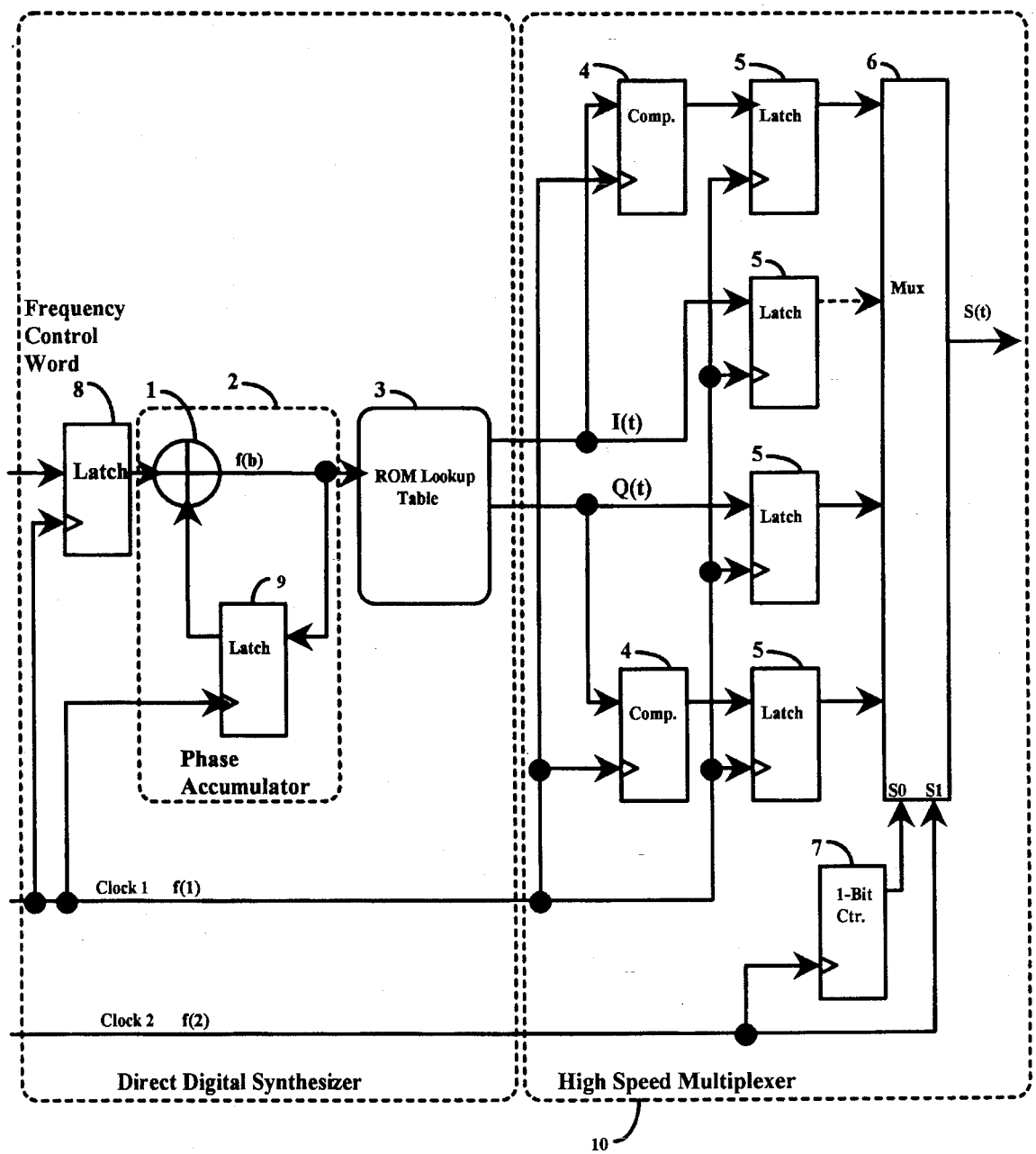
FIG. 1 is a schematic view of a direct digital frequency synthesizer incorporating a frequency translation technique.

The high speed, low power DDS (HS-LP-DDS) according to the present invention consists of a conventional DDS and a high speed multiplexer. The conventional DDS consists of an input latch 8, a phase accumulator 2 including a phase summer 1, and a ROM look-up table 3. The high speed multiplexer includes two complementers 4, four output latches 5, a 1-bit counter 7, and a multiplexer 6.

FIG. 1 illustrates the direct digital frequency synthesizer architecture which incorporates the preferred embodiment of the present invention. A binary digital word is provided as a frequency control word input from the input latch 8 to the phase summer 1 of the phase accumulator 2. The input frequency control word determines the output signal frequency location. The phase summer computes the sum of the frequency control word and the previous output of the phase accumulator 2 which is fed into the summer 1, by a latch 9, also provided in the phase accumulator 2. The carry bit indicating the overflow of the accumulator is ignored. The modulo property of a binary adder results in periodicity of the phase accumulator 2 which is determined by the number of bits resolution in the phase accumulator, the exact value of the frequency control word, and the clock frequency, $f_1$, at which the phase accumulator is updated. Both the latch 8 and the latch 9 are connected to the same clock source. The fundamental frequency which is produced in the signal at the output of the phase accumulator is hereby denoted as $f_b$ in Hertz.

The contents of the phase accumulator represents the phase value of the sine or cosine from 0 to $2\pi$ and is used as the input address to the ROM look-up table 3. The ROM look-up table 3 is used to perform the phase-to-amplitude conversion at a frequency of $f_1$. It generates the output amplitude values for both the sine and cosine waves. The output latches of the high speed multiplexer 10 store sine and cosine and their complements which are generated by the complementer 4 simply be negating the sine I(t) and cosine Q(t) samples.

Figure 3:
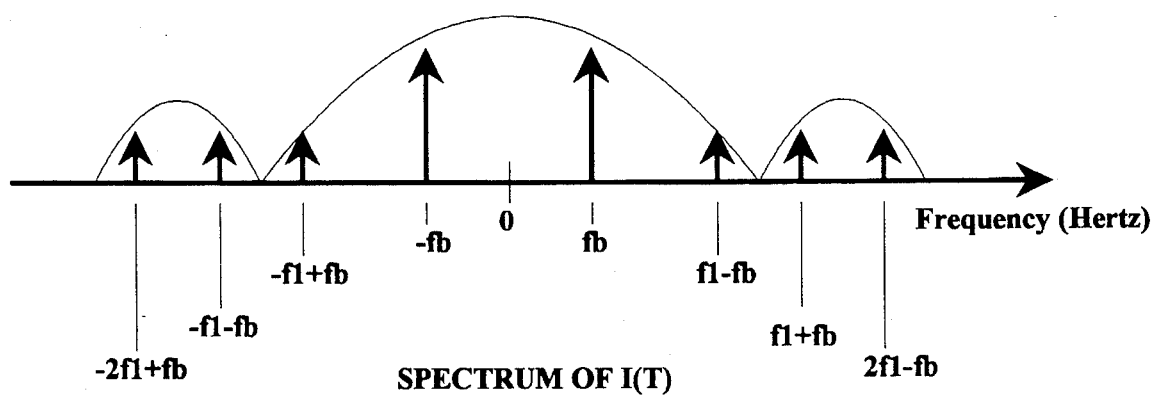
FIG. 3 is a schematic illustration of the fundamental frequency components of the intermediate direct digital frequency synthesizer output I(t), the signal at the output of the phase to amplitude conversion lookup table.

FIG. 3 illustrates the fundamental and some of the key harmonic frequency components of the signals which are generated at the output of the ROM lookup tables, which is the typical output of the conventional DDS. The spectrum is centered about 0 Hz frequency.

Referring back to FIG. 1, two sets of samples are reclocked into a set of latches 5 at a frequency of $f_1$ set by clock 1. These samples are then employed as the inputs to a four state multiplexer 6. The multiplexer is further controlled by two select inputs. The select inputs are set essentially by a higher frequency clock operating at frequency $f_2$ set by clock 2. A toggle flip-flop or 1-bit counter 7 serves to divide the frequency of clock 2 by two. The output of the 1-bit counter 7 and the state of clock 2 are utilized as the two select inputs. The combination of clock 2 and the output of the 1-bit counter 7 provide a periodic four state sequence which permits the selection of one of each of the sine, cosine, sine complement, cosine complement samples. Selected in the proper sequence, the output of the multiplexer 6 yields a sinusoidal output with a fundamental output frequency determined by $f_1$ translated in frequency to $f_2$.

The input latch 8, the accumulator 2, the ROM look-up table 3, the two complementers 4, and the output latches are all clocked by the same clock at a frequency of $f_1$. The multiplexer 6 is clocked with a different clock $f_2$. The multiplexer 6 sequentially selects the sine, cosine, the complement of sine, and the complement of cosine signal samples.

Figure 5:
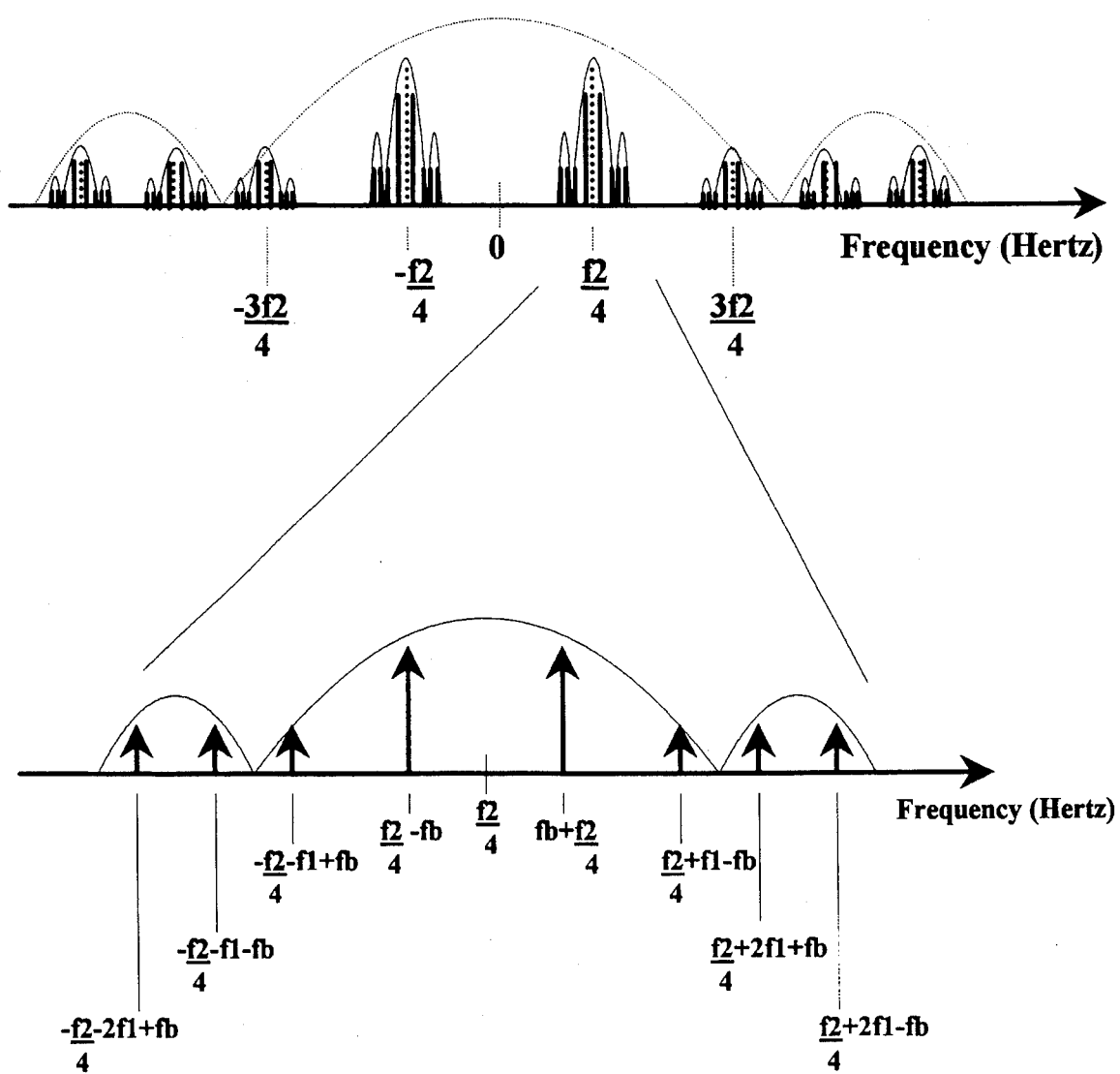
FIG. 5 is a schematic illustration of the fundamental frequency components of the final frequency translated direct digital frequency synthesizer output, S(t).

FIG. 5 illustrates the fundamental and some of the key harmonic frequency components which are generated in the output signal S(t) which is produced at the output of the multiplexer 6.

Figure 2:
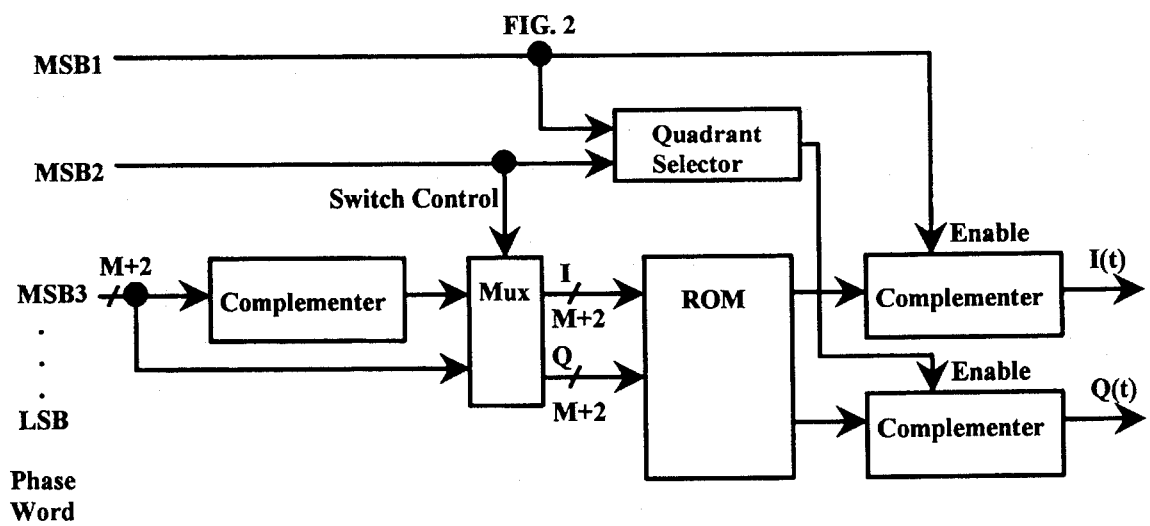
FIG. 2 is a schematic view of a ROM lookup table implementation which results in a four to one reduction of the table size by capitalizing upon the quarter-wave symmetry of sine and cosine functions.

A few simplifications can be incorporated in the structure of the present invention. First, the size of the ROM lookup table can be reduced by a factor of four by taking advantage of the quadrature symmetry of the sine and cosine function. It is noted that in the range of $[0,\pi]$ (or $[\pi,2\pi]$), the sine is symmetrical about $\pi/2$ (or $3\pi/2$). In addition, the sine value is complemented when the phase is increased or decreased by $\pi$. As shown in FIG. 2, the complement of the sine value can be obtained by simply using the most significant bit (MSB) of the phase value to control the polarity of the output value. The 2nd MSB of the phase value can be used to complement the remaining least significant bits (LSBs) of the phase value to take advantage of the symmetry about $\pi/2$ (or $3\pi/2$). The cosine value can be obtained by the following mapping of the phase values:

| Phase value of Sine | | Phase value of cosine | |
|---|---|---|---|
| MSB1 | MSB2 | MSB1 | MSB2 |
| 0 | 0 | 0 | 1 |
| 0 | 1 | 1 | 0 |
| 1 | 0 | 1 | 1 |
| 1 | 1 | 0 | 0 |

Second, it is not necessary to use the full precision of the phase value as the address for the ROM look-up table. It has been determined that if the output of the ROM table is M bits, the input to the ROM table (assuming already reduced by a factor of four by incorporating quadrature symmetry) can be truncated to only M+2 bits without significant increase in the distortion of the output waveform. This reduces the size of the ROM lookup table to M+2 by M. Further simplifications of the ROM table can be achieved by using the sum of two smaller, "coarse" and "fine" ROM tables.

The operation of the invention is explained as follows: As shown in FIG. 1, the HS-LP DDS consists of two parts, a conventional DDS and a high speed multiplexer. Starting with a description of the operation of the conventional DDS, the contents of the phase accumulator represent the phase value of the sinusoid from 0 to $2\pi$ and the input frequency word determines the time rate of change of the phase accumulator. If the phase accumulator is an N-bit accumulator, the rate at which the accumulator cycles through the phase value is given by the formul $$F_{1,out} \text{ (in Hz)} = \frac{f_1 \times \text{Frequency Word}}{2^N}$$

where $f_1$ is the frequency of the clock for the phase accumulator.

The conventional DDS is realized by converting the output of the ROM lookup table into an analog waveform by the use of a digital-to-analog converter (DAC). The power spectrum of the output of the signal at the output of the ROM lookup table is shown in FIG. 3. First, it is noted that there are several aliased harmonics which appear in the output spectrum. The main component of the output spectrum is at $-f_b$ and $f_b$. Aliased components appear at the frequencies, $F_{1,out}+k\times f_1$ and $-F_{1,out}+k\times f_1$. The amplitude of the output power spectrum is determined by an envelope function of $(\sin(2\pi f_1 \times f)/2\pi f_1)^2$. When the output frequency is close to $f_1/2$, the location of the main signal frequency component will be very close to the first aliased component. This places severe requirements (sharp out-of-band attenuation) on the filter which is used to extract the main signal component at the output of the digital-to-analog converter. This is the reason that most applications of the DDS restricts the highest output frequency to be roughly $f_1/3$.

The distortion of the output waveform is determined by several factors:

1. Amplitude Distortion

The amplitude truncation of the ROM lookup table introduces truncation noise. The signal to (truncation) noise power ratio is given by $SNR_{(truncation)}(dB)=6\times M+1.8$ 2. Phase Truncation Noise The maximum output jitter due to the phase truncation noise is given by Phase Truncation Jitter (dB)$=-6\times N$ Other distortions can be introduced by the use of the digital-to-analog converter to convert the digital output of the ROM lookup table to analog waveform.

The limitations associated with the conventional DDS implementation for high speed (frequency) applications are:

1. High Power Consumption

In order to achieve the high speed (frequency) operation, the frequency of the clock $f_1$ should be high. The N-bit accumulator implementation needs to be highly pipelined to be able to operate at a high clock rate. This results in large power dissipation in the phase accumulator.

2. Low Operating Speed

The speed limitation imposed by the ROM lookup table and the phase accumulator determine the highest operating frequency of the conventional DDS. Several techniques can be used to improve the speeds of the DDS. For example, the operating speed of the ROM lookup table can usually be improved by breaking up the ROM table into two smaller ROM tables. The outputs of the smaller ROM tables are combined to form the original ROM table values as described by [Sundsrom] or by [Henrieli]. The operating speed of the phase accumulator can also be improved by employing a pipelined implementation. However, these techniques result in limited improvement in the operating speed.

With the addition of a high speed multiplexer to the conventional DDS, the speed of the DDS can be improved and/or the power consumption can be reduced. The operating principle of the HS-LP-DDS is based on the following expression:

$$SIN(2\pi f_b t + 2\pi(f_2/4)t) = SIN(2\pi f_b t) \times COS(2\pi f_2 t) + COS(2\pi f_b t) \times SIN(2\pi f_2 t) \quad (1)$$

Note that if the multiplexer is operating at $f_2$ frequency, the sine and cosine values become:

$$SIN(2\pi(f_2/4)t_k) = \begin{cases} 0, & \text{if } k = 4 \times i \\ 1, & \text{if } k = 4 \times i + 1 \\ 0, & \text{if } k = 4 \times i + 2 \\ -1, & \text{if } k = 4 \times i + 3 \end{cases}$$

and $$COS(2\pi(f_2/4)t_k) = \begin{cases} 1, & \text{if } k = 4 \times i \\ 0, & \text{if } k = 4 \times i + 1 \\ -1, & \text{if } k = 4 \times i + 2 \\ 0, & \text{if } k = 4 \times i + 3 \end{cases}$$

where $t_k = k/f_2$ and i is an integer.

Equation (1) becomes:

$$SIN(2\pi(f_b t_k + 2\pi(f_2/4)t_k)) = \begin{cases} SIN(2\pi(f_b t_k), & \text{if } k = 4 \times i \\ COS(2\pi(f_b t_k), & \text{if } k = 4 \times i + 1 \\ -SIN(2\pi(f_b t_k), & \text{if } k = 4 \times i + 2 \\ -COS(2\pi(f_b t_k), & \text{if } k - 4 \times i + 3 \end{cases}$$

Also note that if $f_1 \ll f_2$, $SIN(2\pi(f_b t_k))$ can be approximated by $SIN(2\pi f_b(i/f_1))$ for all $t_k$ within the range of $[(i/f_1)-(1/2f_1), (i/f_1)+(1/(2f_1))]$. Thus, the phase changes due to the frequency component $f_2$ can be realized by multiplexing between sine, cosine, and their complements.

Figure 4:
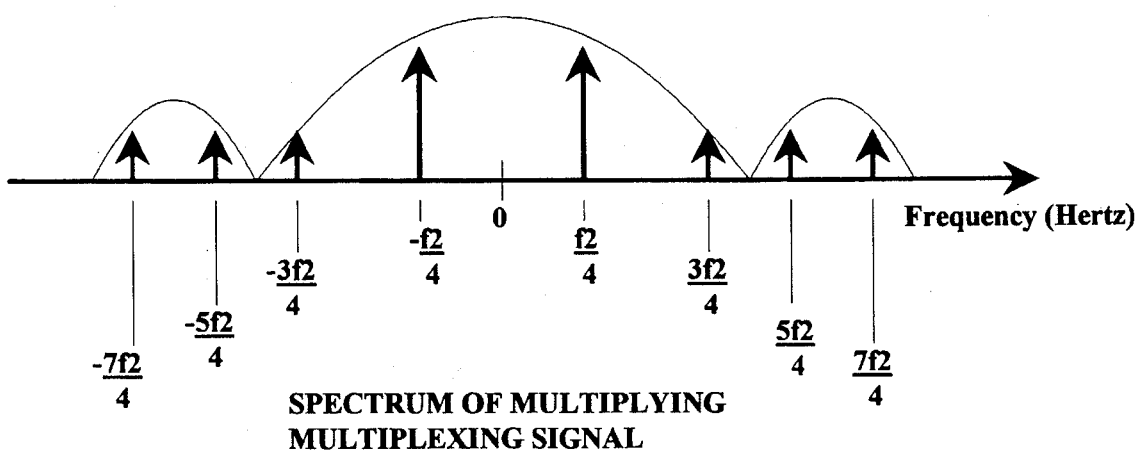
FIG. 4 is a schematic illustration of the output frequency components of a signal which has the equivalent effect of the complement and multiplexing operations upon the intermediate direct digital frequency synthesizer output when this signal is multiplied with this output.

The power spectrum of the output of the multiplexer is the convolution of two power spectra. One of the power spectrums is the same as the output of conventional DDS with frequency $f_b$ and clock $f_1$. The other one is shown in FIG. 4. The location of the signal tones are at $(j-1/2) \times f_2$ for all integers, j. The envelope of the spectrum is $SIN(2\pi f_2 \times f)2/\pi f_2)^2$. The resulting convoluted power spectrum is shown in FIG. 5.

It is advisable that the clock frequencies, $f_1$ and $f_2$, satisfy the relationship $f_2 > f_1 \times 2^{M+2}$. This results in very little distortion. Note that $f_1$ can be derived from $f_2$.

Since in general $f_1$ is much lower than $f_2$, the power consumption due to the accumulator operation is significantly reduced. In addition, the operating speed of the HS-LP DDS is now limited by the operating speed of the multiplexer instead of the accumulator or the ROM table. Thus, much higher operating speed can be achieved.

The improved DDS architecture of this invention provides a method to generate a sinusoidal output waveform over conventional DDS architecture by using a high speed multiplexer employed to frequency translate the intermediate output signal at the output of the sinusoidal ROM lookup table phase-to-amplitude converter which represents the output of the conventional DDS. Furthermore, the invention has the additional advantages in that it provides an increase in the highest possible desired output signal frequency without requiring a corresponding increase in the frequency of operation of the phase accumulator and the phase to amplitude conversion lookup table functions and thereby not significantly increase power dissipation.

Additionally, the present invention eliminates the limitation of the operating speed of the phase accumulator functions and/or the operating speed of the phase to amplitude conversion lookup table functions.

Furthermore, the present invention achieves a power savings over the prior art DDS architectures in generating a given output frequency because the phase accumulator and the phase to amplitude conversion lookup tables functions can operate at lower frequency.

While our above description contains many specificities, these should not be construed as limitations on the scope of the invention, but rather as an exemplification of one preferred embodiment thereof. Many variations are possible. For example, the phase accumulator can have a PN circuit feeding the carry in input in order to flatten the spurious output signal spectrum; the phase accumulator can be pipelined to further speed up operating performance; the ROM lookup table can be implemented with two smaller ROM lookup tables whose outputs are combined with a summing network, etc. Thus the scope of the invention should be determined by the appended claims and their legal equivalents, rather than by the examples given.

What is claimed is:

1. A device for generating programmable digital sine and cosine waves comprising:

a direct digital synthesizer including:

an input latch having first and second inputs and outputs, said first input connected to an input frequency control word and said second input connected to a first clock frequency $f_1$;

a phase accumulator provided with an output, said phase accumulator connected to said output of said input latch producing an intermediate phase output frequency based upon said input frequency control word, said first clock frequency $f_1$ and a previous output of said phase accumulator;

a solid state lookup table connected to said output of said phase accumulator for generating sine and cosine output amplitude signal samples based upon said output of said phase accumulator, said lookup table provided with an output;

a high speed multiplexer connected to the output of said lookup table, said multiplexer including:

a first complementer connected to said output of said lookup table for negating said sine output amplitude signal sample and connected to said first clock frequency of $f_1$ for producing a negated sine output amplitude signal sample;

a second complementer connected to said output of said lookup table for negating said cosine output amplitude signal sample and connected to said first clock frequency of $f_1$ for producing a negated cosine output amplitude signal sample;

a plurality of second latch devices, each of said second latch devices connected to said lookup table output, and connected to said first clock frequency $f_1$, each of said second latch devices provided with respective outputs;

a plurality of third latch devices, each of said third latch devices connected to said first complementer or said second complementer and connected to said first clock frequency $f_1$, each of said third latch devices provided with respective outputs;

a multiplexer connected to the outputs of said second and third latch devices and to a second clock frequency $f_2$;

a switching device connected to said second clock frequency generator and producing an output frequency $f_3$ less than $f_2$, said output frequency $f_3$ connected to said multiplexer, wherein the combination of $f_2$ and $f_3$ produce a periodic four state sequence permitting the selection of one of said sine, cosine, negated sine or negated cosine amplitude signal samples, thereby yielding a sinusoidal output with a fundamental output frequency $f_1$ translated in frequency to $f_2$.

2. The device for generating programmable digital sine and cosine waves in accordance with claim 1, wherein $f_2 > f_1 \times 2^{M+2}$, where M is equal to the number of bits of the output of said solid state lookup table.

3. The device for generating programmable digital sine and cosine waves in accordance with claim 2 wherein said solid state lookup table is a read only memory device.

4. The device for generating programmable digital sine and cosine waves in accordance with claim 1 wherein said solid state lookup table is a read only memory device.

5. The device for generating programmable digital sine and cosine waves in accordance with claim 1, wherein said first clock frequency $f_1$ is generated by a first clock frequency generator and said second clock frequency $f_2$ is generated by a second clock frequency generator.

6. The device for generating programmable digital sine and cosine waves in accordance with claim 1, wherein said first clock frequency $f_1$ and said second clock frequency $f_2$ are generated by a first clock frequency generator and $f_1$ is a function of $f_2$.

* * * * *